(12) United States Patent
Groen (10) Patent No.: US 7,313,176 B1
(45) Date of Patent: Dec. 25, 2007

(54) PROGRAMMABLE ON CHIP REGULATORS WITH BYPASS

(75) Inventor: Eric D. Groen, Ankeny, IA (US)

(73) Assignee: Xilinx, Inc., San Jose, CA (US)

( * ) Notice: Subject to any disclaimer, the term of this patent is extended or adjusted under 35 U.S.C. 154(b) by 667 days.

(21) Appl. No.: 10/660,190

(22) Filed: Sep. 11, 2003

(51) Int. Cl.
*H04B 1/38* (2006.01)

(52) U.S. Cl. .................................... 375/219

(58) Field of Classification Search ............ 375/219, 375/226, 297, 356, 376; 370/535–537, 542; 710/71; 341/100–101; 327/53, 66, 132; 307/15
See application file for complete search history.

(56) References Cited

U.S. PATENT DOCUMENTS

| | | | |
|---|---|---|---|
| 3,656,006 A * | 4/1972 | Bourke et al. | 327/381 |
| 3,754,159 A * | 8/1973 | Andrews | 315/382 |
| 4,165,640 A * | 8/1979 | Feser | 73/861 |
| 5,438,329 A * | 8/1995 | Gastouniotis et al. | 340/870.02 |
| 5,930,729 A * | 7/1999 | Khamis et al. | 455/571 |
| 6,072,359 A * | 6/2000 | Brambilla et al. | 327/538 |
| 2001/0049812 A1* | 12/2001 | Lutkemeyer | 716/6 |
| 2001/0054878 A1* | 12/2001 | Odaohhara | 320/118 |
| 2002/0089727 A1* | 7/2002 | Alwan et al. | 359/187 |
| 2002/0180413 A1* | 12/2002 | Umminger et al. | 323/284 |
| 2002/0188887 A1* | 12/2002 | Largman et al. | 714/13 |
| 2003/0155977 A1* | 8/2003 | Johnson et al. | 330/290 |
| 2004/0025075 A1* | 2/2004 | Lutkemeyer | 713/401 |
| 2004/0192410 A1* | 9/2004 | Kralik et al. | 455/573 |
| 2005/0024103 A1* | 2/2005 | Nascimentto | 327/112 |
| 2005/0169416 A1* | 8/2005 | Liu | 375/362 |

OTHER PUBLICATIONS

U.S. Appl. No. 10/659,803, filed Sep. 11, 2003, Black et al.
U.S. Appl. No. 10/659,971, filed Sep. 11, 2003, Boecker et al.
U.S. Appl. No. 10/660,448, filed Sep. 11, 2003, Groen et al.

* cited by examiner

*Primary Examiner*—Khanh C. Tran
(74) *Attorney, Agent, or Firm*—James Harrison; Michael R. Hardaway (57) ABSTRACT

A device and a method for processing high data rate serial data includes circuitry for recovering or generating a clock based with varying amounts of phase noise or jitter based upon a particular application. To achieve the foregoing, regulated and unregulated power are selectively provided to the circuitry for recovering a clock, to the circuitry for generating a transmission clock, and to any other circuitry having different tolerance levels for jitter and phase noise. Each power regulator comprises a current supply module and voltage regulator module. The current supply module provides one of a plurality of selectable output current levels into an output node of the regulator. The voltage regulator module having selectable voltage divider ratios at a first input of a comparator regulates an amount of current the device sinks from the output node to adjust the output voltage.

19 Claims, 10 Drawing Sheets

Figure 1
programmable logic device 10

Figure 2
programmable multi-gigabit transceivers 14-28

Figure 3
programmable multi-gigabit
transceivers 14-28

Figure 4A
programmable receive
PMA module 40

Figure 4B
programmable transmit
PMA module 38

Figure 5
MGT FPGA 200

Figure 6
shunt regulator 224

Figure 7
current source block 234

Figure 8
voltage divider 238

Figure 10
method for converting between parallel data and serial data

Figure 9
method for converting between parallel data and serial data

PROGRAMMABLE ON CHIP REGULATORS WITH BYPASS

BACKGROUND OF THE INVENTION

1. Technical Field of the Invention

This invention relates generally to communication systems and more particularly to clock recovery circuits used therein.

2. Description of Related Art

Communication systems are known to transport large amounts of data between a plurality of end user devices, which, for example, include telephones, facsimile machines, computers, television sets, cellular telephones, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits-per-second, 100 megabits-per-second, 1 gigabit-per-second and beyond. Synchronous Optical NETwork (SONET), for example, currently provides for transmission of 10 gigabits-per-second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss.

Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits, where integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits per second for OC48, to 9.95 gigabits per second for OC192. Other known standards define data rates of 2.5 gigabits per second (INFINI-BAND) or 3.125 gigabits per second (XAUI). These different data rates affect the allowable rise and fall time of the signal, the peak amplitude of the signal and the response time from an idle state. For example, one protocol may specify a peak voltage range of 200-400 millivolts, while another standard specifies a mutually exclusive voltage range of 500-700 millivolts. Thus, a designer either cannot satisfy these mutually exclusive requirements (and therefore cannot support multiple protocols) or must design a high data rate transceiver device that can adapt according to the protocol being used for the communications.

Along these lines, field programmable gate array (FPGA) circuits are gaining in popularity for providing the required flexibility and adaptable performance described above for those designers that seek to build one device that can operate according to multiple protocols. Thus, while FPGA technology affords a designer an opportunity to develop flexible and configurable hardware circuits, specific designs that achieve the desired operations must still be developed.

One design challenge for serial data processing, especially for high data rate communications, relates to synchronization, and in particular to timing differences between a reference clock and high data rate serial stream. Such differences can lead to buffer overflows/underflows, unnecessary delays and other complications. The problem of synchronization mismatch become more acute in devices that conduct multi-gigabit serial data rates. For such systems, it is important to eliminate these mismatches because of the high volume of data being transported. In these systems especially, but more generally in all serial communication systems, even a mismatch of one percent can lead to buffer overflows/underflows and other problems. This problem of high data rate mismatch is a significant problem for any type of device or system that receives, processes or transmits high data rate serial data. A need exists, therefore, for a device and accompanying method with broad applicability that resolves high data rate mismatch between the data and a given clock used to operate upon or process the high serial rate data. Along these lines, sources of error often require attention to reduce phase noise and jitter in a clock used for transmission and/or data recovery. One common error source is the unregulated power supply. Thus, for some high data rate communications, a need exists to reduce jitter and/or phase noise that results from unregulated power supplies.

BRIEF SUMMARY OF THE INVENTION

The present invention provides for a device and a method for processing high data rate serial data that reduces or eliminates mismatch between a reference clock and high data rate serial data and the associated problems, including buffer overflow or underflow, that result therefrom. Generally, the invention includes circuitry for recovering a clock based on the high data rate input data stream and for providing the recovered clock to a circuit portion, for example, a portion of a field programmable gate array fabric, or to any circuit portion, to enable the circuit portion to use the recovered clock for subsequent processing. The circuitry for recovering the clock generates a clock with varying amounts of phase noise or jitter based upon a particular application. The invention further includes generating a transmission clock that has an associated amount of jitter that is within a tolerance level for the particular application.

To achieve the foregoing, regulated and unregulated power are selectively provided to the circuitry for recovering a clock, to the circuitry for generating a transmission clock, and to any other circuitry having different tolerance levels for jitter and phase noise. More specifically, a regulated power supply is selectively coupled to transmit phase-locked loop circuitry, to receive phase-locked loop circuitry and to parallel-in-serial-out processing circuitry. In one embodiment, regulated power is also provided to any other circuitry including serial-in-parallel-out circuitry. Generally, according to a serial data rate transmission speed, the different circuits have different requirements for tolerable levels of jitter and phase noise. Thus, the invention includes logic for determining whether a particular circuit is to receive regulated or unregulated power. The logic then provides logic signals to selectively couple the regulated and unregulated power sources to the circuitry in a determined manner. The logic further provides for receiving and operating according to user specified logic.

Each of the regulated power sources, or power regulators, comprises a current supply module and voltage regulator module. The current supply module provides one of a plurality of selectable output current levels into an output node of the regulator. In one embodiment, the current supply module includes a current mirror having a plurality of scaled and selectable mirror devices that each provide a proportional amount of current relative to a reference current.

The voltage regulator module includes a comparator (amplifier) that produces an output voltage to bias a device to regulate an amount of current the device sinks from the output node. The comparator increases and decreases the bias signal magnitude to increase and decrease an amount of current that is sinked from the output node responsive to increases and decreases in an output voltage level at the output node. To accomplish this result, the comparator includes a voltage divider at a first input of the comparator wherein a voltage received from the voltage divider is compared to a reference voltage received from an external source.

The voltage divider, in one embodiment of the invention, further includes selectable resistors (or resistor configured and biased MOSFETs) to provide for adjustments to the voltage divider ratio. Accordingly, changes in the reference voltage from an expected amount can be compensated for by modifying the voltage divider ratios to correspondingly adjust the voltage divider ratio and corresponding input to the comparator.

DETAILED DESCRIPTION OF THE INVENTION

Figure 1:
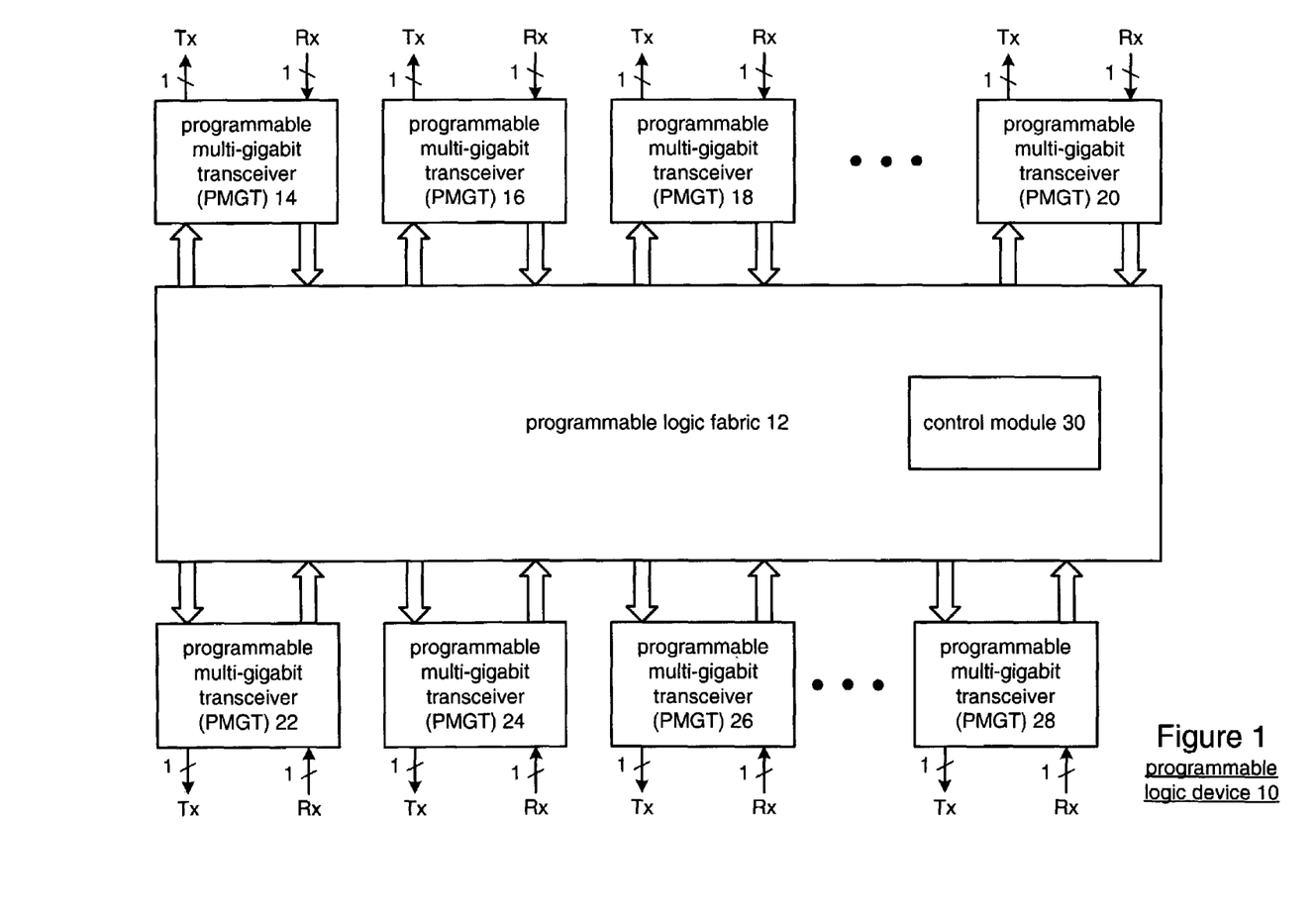
FIG. 1 is a schematic block diagram of a programmable logic device that includes programmable logic fabric, a plurality of programmable multi-gigabit transceivers (PMGTs) and a control module.

FIG. 1 is a schematic block diagram of a programmable logic device (PLD) 10 that includes programmable logic fabric 12, a plurality of programmable multi-gigabit transceivers (PMGTs) 14-28 and a control module 30. The programmable logic device 10 may be a programmable logic array device, a programmable array logic device, an erasable programmable logic device, and/or a field programmable gate array (FPGA). When the programmable logic device 10 is an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, the control module 30 generates the control signals to program each of the transmit and receive sections of the PMGTs transceivers 14-28. In general, each of the PMGTs 14-28 performs a serial-to-parallel conversion on receive data and performs a parallel-to-serial conversion on transmit data. The parallel data may be, for instance, 8-bits, 16-bits, 32-bits, or 64-bits wide.

Typically, the serial data will be a 1-bit stream of data that may be a binary level signal, multi-level signal, etc. Further, two or more programmable multi-gigabit transceivers may be bonded together to provide greater transmitting speeds. For example, if PMGTs 14, 16 and 18 are transceiving data at 3.125 gigabits-per-second, the PMGTs 14, 16 and 18 may be bonded together such that the effective serial rate is approximately 3 times 3.125 gigabits-per-second.

Each of the programmable multi-gigabit transceivers 14-28 may be individually programmed to conform to separate standards. In addition, the transmit path and receive path of each programmable multi-gigabit transceiver 14-28 may be separately programmed such that the transmit path of a transceiver is supporting one standard while the receive path of the same transceiver is supporting a different standard. Further, the serial rates of the transmit path and receive path may be programmed, for example, from 1 gigabit-per-second to tens of gigabits-per-second. The size of the parallel data in the transmit and receive sections, or paths, is also programmable and may vary, for instance, from 8-bits, 16-bits, 32-bits, or 64-bits.

Figure 2:
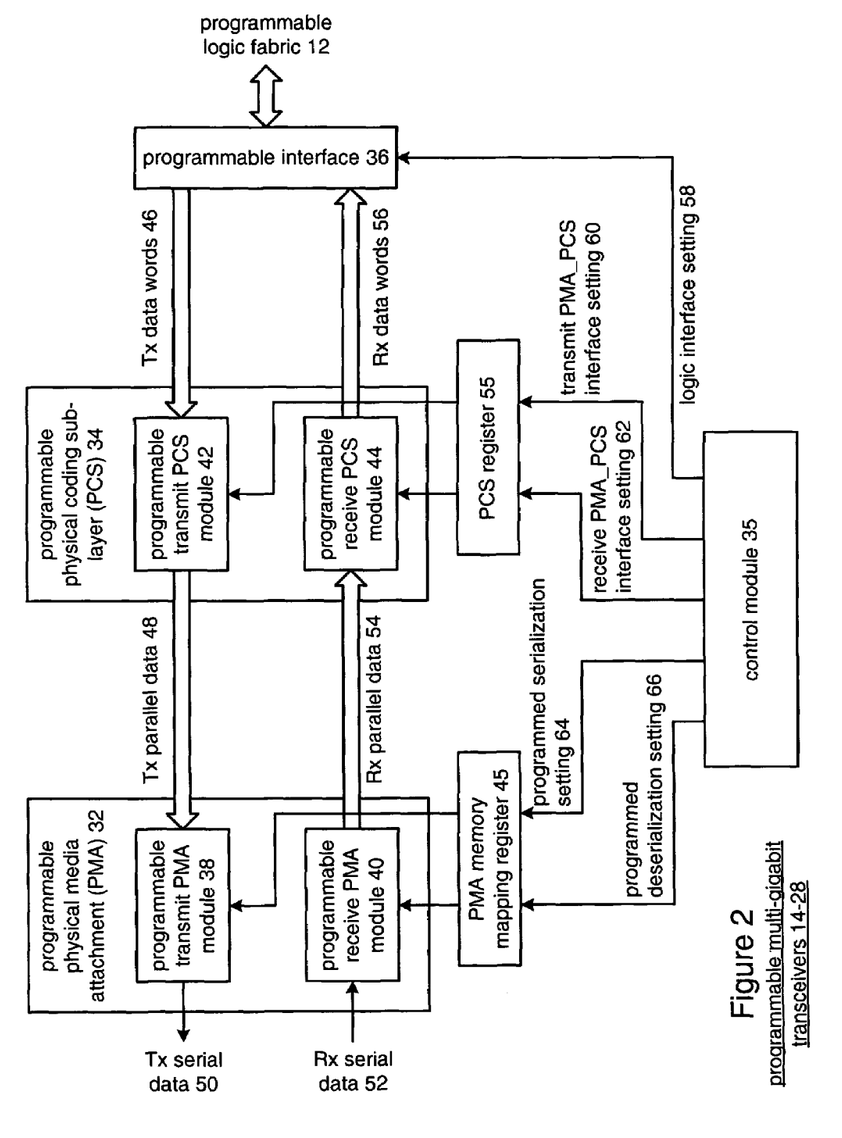
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14-28. As shown, the programmable multi-gigabit transceiver includes a programmable physical media attachment (PMA) module 32, a programmable physical coding sub-layer (PCS) module 34, a programmable interface 36, a control module 35, a PMA memory mapping register 45 and a PCS register 55. The control module 35, based on the desired mode of operation for the individual programmable multi-gigabit transceiver 14-28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30 of FIG. 1.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58-66.

The programmable physical media attachment (PMA) module 32 includes a programmable transmit PMA module 38 and a programmable receive PMA module 40. The programmable transmit PMA module 38, which will be described in greater detail with reference to FIG. 4B, is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable physical coding sub-layer (PCS) module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., 1-byte, 2-bytes, 3-bytes, 4-bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA module 32 and PCS module 34 may be individually programmed to support a desired data transfer rate. The data transfer rate may be in accordance with a particular standard such that the receive path, i.e., the path through programmable receive PMA module 40 and the programmable receive PCS module 44, may be programmed in accordance with one standard, while the transmit path, i.e., the path through the programmable transmit PCS module 42 and the programmable transmit PMA module 38, may be programmed in accordance with the same or another standard.

Figure 3:
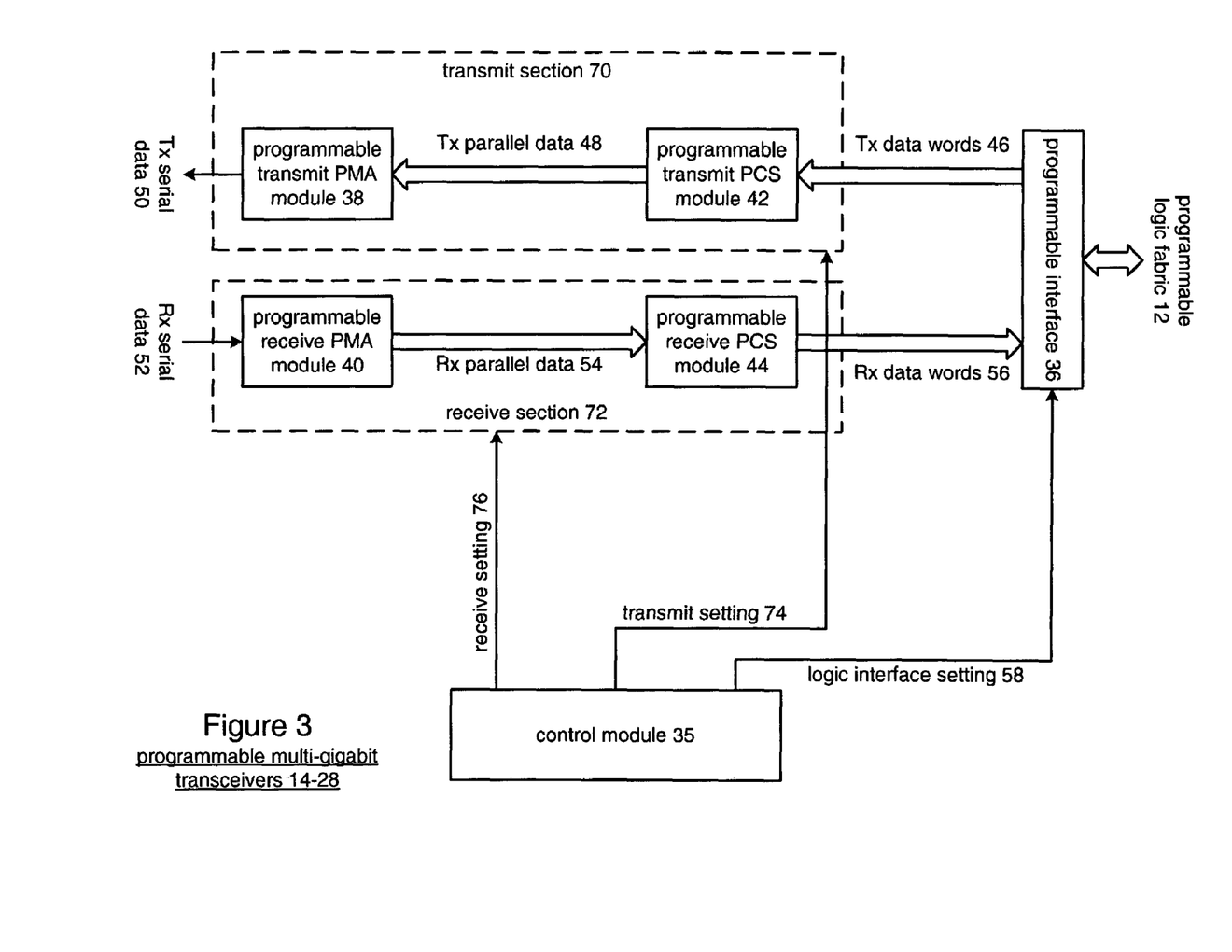
FIG. 3 illustrates an alternate schematic block diagram of a representative one of the programmable multi-gigabit transceivers.

FIG. 3 illustrates an alternate schematic block diagram of a representative one of the programmable multi-gigabit transceivers 14-28. In this embodiment, the PMGTs 14-28 include a transmit section 70, a receive section 72, the control module 35 and the programmable interface 36. The transmit section 70 includes the programmable transmit PMA module 38 and the programmable transmit PCS module 42. The receive section 72 includes the programmable receive PMA module 40 and the programmable receive PCS module 44.

In this embodiment, the control module 35 separately programs the transmit section and the receive section via transmit setting 74 and receive setting 76, respectively. The control module 35 also programs the programmable interface 36 via the logic interface setting 58. Accordingly, the control module 35 may program the receive section 72 to function in accordance with one standard while programming the transmit section 70 in accordance with the same or another standard. Further, the logic interface setting 58 may indicate that the transmit data words 46 are received from the programmable logic fabric 12 at a different rate than the receive data words 56 are provided to the programmable logic fabric 12. As one of average skill in the art will appreciate, the programmable interface 36 may include a transmit buffer and a receive buffer, and/or an elastic store buffer to facilitate the providing and receiving of transmit data words 46 and receive data words 56 to and from the programmable logic fabric 12.

Figure 4A:
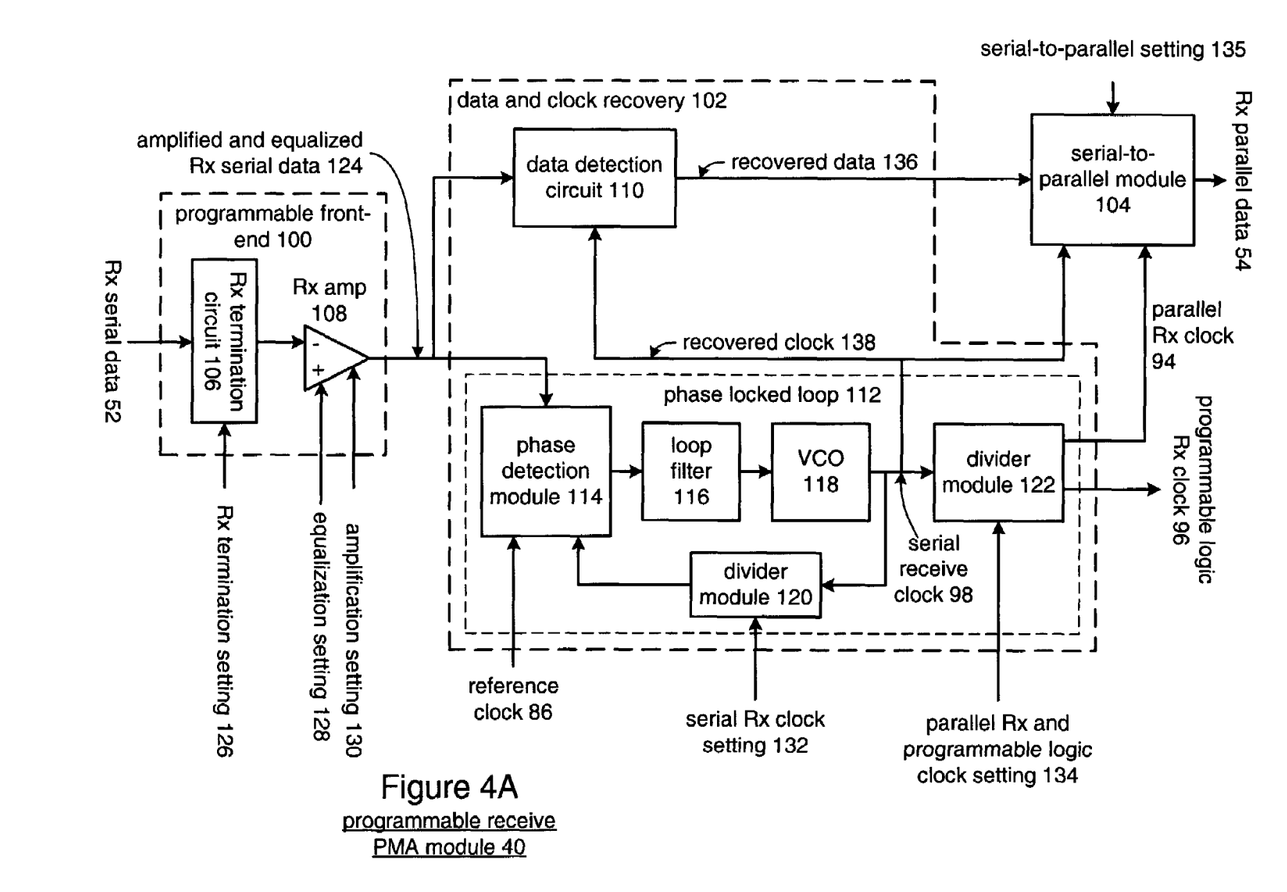
FIG. 4A illustrates a schematic block diagram of the programmable receive PMA module that includes a programmable front-end, a data and clock recovery module, and a serial-to-parallel module.
Figure 4B:
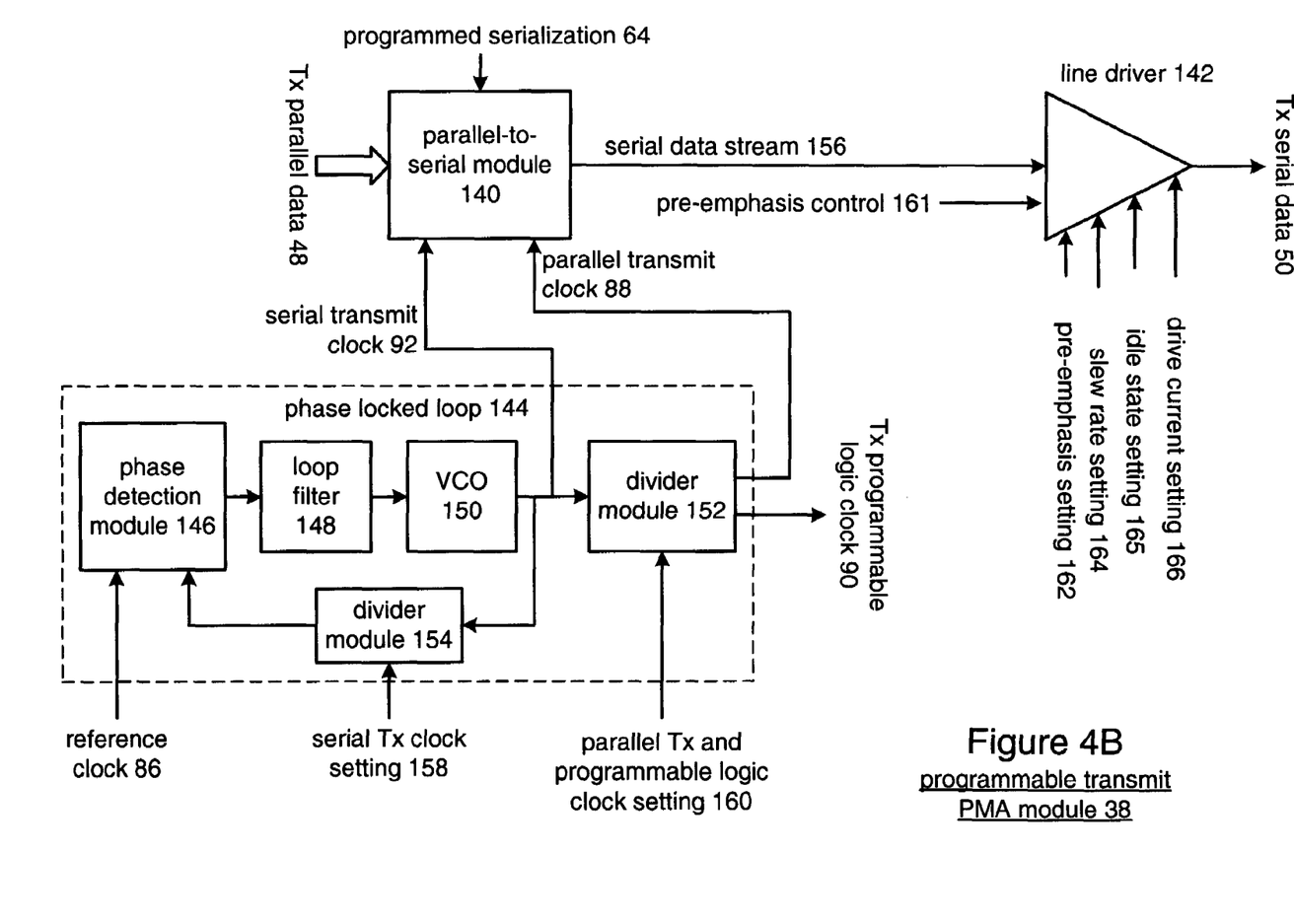
FIG. 4B illustrates a schematic block diagram of a programmable transmit PMA module that includes a phase-locked loop, a parallel-to-serial module, and a line driver.

FIG. 4A illustrates a schematic block diagram of the programmable receive PMA module 40 that includes a programmable front-end 100, a data and clock recovery module 102, and a serial-to-parallel module 104. The programmable front-end 100 includes a receive termination circuit 106 and a receive amplifier 108. The data and clock recovery module 102 includes a data detection circuits 110 and a phase-locked loop 112. The phase-locked loop 112 includes a phase detection module 114, a loop filter 116, a voltage controlled oscillator (VCO) 118, a first divider module 120, and a second divider module 122.

The programmable front-end 100 is operably coupled to receive the receive serial data 52 and produce amplified and equalized receive serial data 124 therefrom. To achieve this, the receive termination circuit 106 is programmed in accordance with a receive termination setting 126 to provide the appropriate termination for the transmission line between the programmable receive PMA module 40 and the source that originally transmitted the receive serial data 52. The receive termination setting 126 may indicate whether the receive serial data 52 is a single-ended signal, a differential signal, may indicate the impedance of the receive termination circuit 106. For a more detailed discussion of the receive termination circuit 106, refer to co-pending patent application entitled RECEIVER TERMINATION NETWORK AND APPLICATION THEREOF, by Charles W. Beocker, et al., and having the same filing date as the present application. This co-pending application is incorporated by reference, herein.

The receive termination circuit 106 further biases the receive serial data 52 and provides the bias adjusted signal to the receive amplifier 108. The equalization and gain setting of the receive amplifier 108 may be adjusted in accordance with equalization setting 128 and amplification setting 130, respectively. The receive amplifier 108 is further described in co-pending patent application entitled ANALOG FRONT-END HAVING BUILT-IN EQUALIZATION AND APPLICATION THEREOF, by William C. Black, et al., and having a filing data the same as the present patent application. This co-pending application is incorporated by reference, herein. Note that the receive termination setting 126, the equalization setting 128, and the amplification setting 130 are part of the programmed deserialization setting 66 provided by the control module 35.

The data and clock recovery module 102 receives the amplified and equalized receive serial data 124 via the phase detection module 114 of phase-locked loop 112 and via the data detection circuit 110. The phase detection module 114 has been initialized prior to receiving the amplified and equalized receive serial data 124 by comparing the phase and/or frequency of a reference clock 86 with a feedback reference clock produced by divider module 120. Based on this phase and/or frequency difference, the phase detection module 114 produces a corresponding current that is provided to loop filter 116. The loop filter 116 converts the current into a control voltage that adjusts the output frequency of the VCO 118. The divider module 120, based on a serial receive clock setting 132, divides the output oscillation produced by the VCO 118 to produce the feedback signal. Once the amplified and equalized receive serial data 124 is received, the phase detection module 114 compares the phase of the amplified and equalized receive serial data 124 with the phase of the feedback signal, and produces a current signal based on the phase difference.

The phase detection module 114 provides the current signal to loop filter 116, which converts it into a control voltage that controls the output frequency of the voltage controlled oscillator 118. At this point, the output of the voltage controlled oscillator 118 corresponds to a recovered clock 138 in steady state operation. The recovered clock 138 is provided to the divider module 122, the data detection circuit 110 and to the serial-to-parallel module 104. The data detection circuit 110 utilizes the recovered clock 138 to produce recovered data 136 from the amplified and equalized receive serial data 124. The divider module 122 divides the recovered clock 138, in accordance with a parallel receive and programmable logic clock setting 134, to produce a parallel receive clock 94 and a programmable logic receive clock 96. Note that the serial receive clock setting 132 and the parallel receive and programmable logic clock setting 134 are part of the programmed deserialization setting 66 provided to the programmable receive PMA module 40 by the control module 35.

The serial-to-parallel module 104, which may include an elastic store buffer, receives the recovered data 136 at a serial rate in accordance with the recovered clock 138. Based on a serial-to-parallel setting 135 and the parallel receive clock 94, the serial-to-parallel module 104 outputs the receive parallel data 54. The serial-to-parallel setting 135, which may be part of the programmed deserialization setting 66, indicates the data rate and data width of the receive parallel data 54.

FIG. 4B illustrates a schematic block diagram of a programmable transmit PMA module 38 that includes a phase-locked loop 144, a parallel-to-serial module 140, and a line driver 142. The phase-locked loop 144 includes a phase detection module 146, a loop filter 148, a voltage controlled oscillator (VCO) 150, a divider module 154, and a divider module 152.

The phase detection module 146 compares the phase and/or frequency of the reference clock 86 with the phase and/or frequency of an output produced by divider module 154. The phase detection module 146 generates a current signal to represent the phase and/or frequency difference between the reference clock 86 and the feedback oscillation. The loop filter 148 converts the current signal into a control voltage that regulates the output oscillation produced by the VCO 150. Divider module 154, based on a serial transmit clock setting 158, divides the output oscillation of the VCO 150, which corresponds to a serial transmit clock 92, to produce the feedback oscillation. Note that the serial transmit clock setting 158 may be part of the programmed serialization setting 64 provided to the programmable transmit PMA module 38 by the control module 35.

Divider module 152 receives the serial transmit clock 92 and, based on a parallel transmit and programmable logic clock setting 160, produces a parallel transmit clock 88 and a transmit programmable logic clock 90. The parallel transmit and programmable logic clock setting 160 may be part of the programmed serialization setting 64.

The parallel-to-serial module 140 receives the transmit parallel data 48 and produce therefrom a serial data stream 156. To facilitate the parallel-to-serial conversion, the parallel-to-serial module 140, which may include an elastic store buffer, receives a parallel-to-serial setting to indicate the width of the transmit parallel data 48 and the rate of the transmit parallel data, which corresponds to the parallel transmit clock 88. Based on the parallel-to-serial setting, the serial transmit clock 92 and the parallel transmit clock 88, the parallel-to-serial module 140 produces the serial data steam 156 from the transmit parallel data 48.

The line driver increases the power of the signals forming serial data stream 156 to produce the transmit serial data 50. The line driver 142 may be programmed to adjust its pre-emphasis settings, slew rate settings, and drive settings via a pre-emphasis control signal 161, a pre-emphasis setting signal 162, a slew rate setting signal 164, an idle state setting 165 and a drive current setting 166. The pre-emphasis control signal 161, the pre-emphasis setting signal 162, the slew rate setting signal 164, the idle state setting 165 and the drive current setting 166 may be part of the programmed serialization setting 64. As one of average skill in the art will appreciate, while the diagram of FIG. 4B is shown as a single-ended system, the entire system may use differential signaling and/or a combination of differential and single-ended signaling. Further details on the line driver 142 are described in co-pending patent application entitles DAC BASED DRIVER WITH SELECTABLE PRE-EMPHASIS SIGNAL LEVELS, by Eric D. Groen et al., and having a filing date the same as the present patent application and in co-pending patent application entitled TX LINE DRIVER WITH COMMON MODE IDLE STATE AND SELECTABLE SLEW RATES, by Eric D. Groen et al. and having a filing date the same as the present patent application. These co-pending applications are incorporated by reference, herein.

Figure 5:
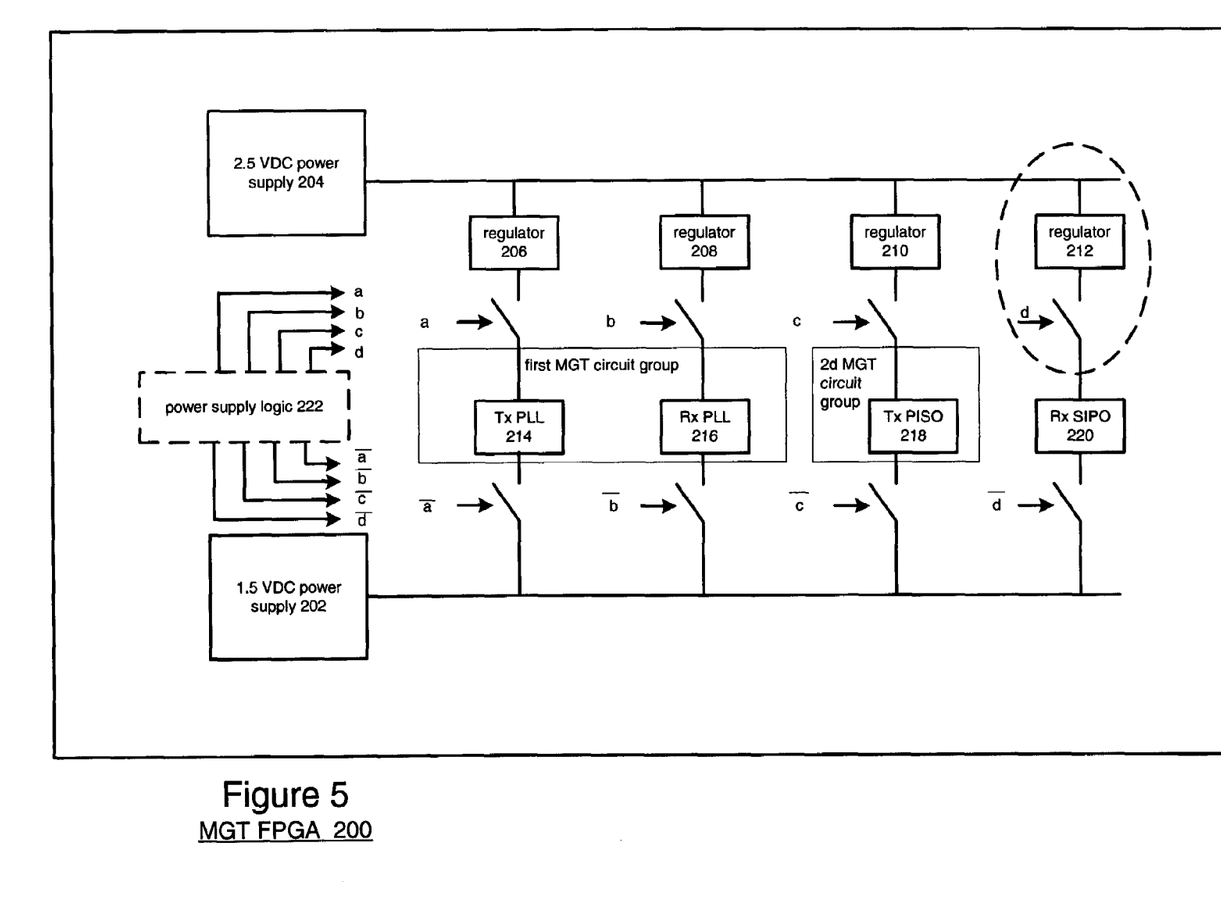
FIG. 5 is a functional block diagram of a multi-gigabit field programmable gate array formed according to one embodiment of the invention.

FIG. 5 is a functional block diagram of a multi-gigabit field programmable gate array formed according to one embodiment of the invention. A multi-gigabit field programmable gate array (MGT FPGA) 200 includes at least one regulated power source and at least one unregulated power source, both of which are coupled to selectively provide regulated and unregulated power to a plurality of circuit groups and/or circuits. More specifically, MGT FPGA 200 includes an unregulated 1.5 VDC power supply 202 that is coupled to selectively provide power to the plurality of circuit groups of MGT FPGA 200. A 2.5 VDC power supply 204 is coupled to provide unregulated power to at least one power regulator which, in turn, is coupled to selectively provide regulated power to the plurality of circuits and circuit groups of the MGT FPGA 200. In the example of FIG. 5, the 2.5 VDC power supply 204 provides unregulated power to regulators 206, 208, 210 and, optionally, 212. Each of the regulators 206-212 is coupled to selectively provide power to a plurality of circuits or circuit groups. A first MGT circuit group, which in the example of FIG. 5 includes a transmit phase-locked loop (Tx PLL) 214 and a receive phase-locked loop (Rx PLL) 216, while a second MGT circuit group includes a transmit parallel-in-serial-out (Tx PISO) 218. Additionally, MGT FPGA 200 includes a receive serial-in-parallel-out (Rx SIPO) 220. Rx SIPO 220 may optionally be coupled to regulator 212 for selectively receiving regulated power therefrom.

Generally, a tradeoff exists between a plurality of competing factors in determining what type of power should be provided to a particular circuit or circuit group. First, circuit designers seek to minimize power consumption for a plurality of reasons, including the avoidance of excess heat from power consumption. Additionally, however, according to application, circuits must be designed to have less than a specified amount of jitter or phase noise. For example, phase noise in a receive PLL affects the ability to recover a clock. Similarly, phase noise on a transmit PLL creates noise on an output signal. A PISO circuit, which receives a plurality of parallel input data streams and produces one high speed serial output stream, produces signals having a very small period, for example, 200 pico-seconds, and therefore is less tolerant to input noise sources. On the other hand, a Rx SIPO converts a high data rate serial data stream into a parallel output stream and is more tolerant of jitter or phase noise on the output because the jitter is a small percentage of the bit period. Typical examples of a bit period output for a PISO and a SIPO are 200 pico-seconds and 1000 pico-seconds, respectively.

More generally, every application of an FPGA is different. Accordingly, there is a need for multi-gigabit transceivers that satisfy customer requirements or applications. Thus, the invention provides for a programmable circuit that allows the various transceiver elements of the plurality of circuits and/or circuit groups within the MGT FPGA 200 to have a degree of flexibility in terms of whether regulated power sources or unregulated power sources should be used therefor.

Generally, the unregulated power supply 204 that provides power to the regulators 206-212 is a 2.5 volt power supply. Because the various circuits use a constant amount of current, the overall power usage is twice in contrast to when a specified circuit utilizes the unregulated power supply. Because some MGT FPGAs, such as MGT FPGA 200, may include as many as 30 such circuits per chip, wherein each is capable of consuming up to one-half watt of power, the total power consumption can approach 15 watts resulting in significant heat generation. Thus, the MGT FPGA 200 utilizes the programmable fabric to adjust an architecture for optimal performance according to, among other factors, user preferences and selective mode or speed of operation.

More specifically, a power supply logic 222 defines operational logic for MGT FPGA 200 and specifically includes logic for operating according to a default mode of operation, as well as operating according to a specified mode and specified user preferences, both of which are specified external to power supply logic 222. Generally, power supply logic 222 generates control signals to selectively couple and decouple regulators 206, 208, 210 and 212 and, conversely, for each of the regulators, 1.5 VDC power supply 202. As may be seen, power supply logic 222 generates four control signals represented herein as a, b, c and d, as well as the logical opposites of the signals, namely, the inverse of a, b, c and d. Thus, if regulator 206 is coupled to Tx PLL 214, then 1.5 VDC power supply 202 is decoupled from Tx PLL 214. Similarly, if regulator 206 is decoupled from Tx PLL 214, then the 1.5 VDC power supply 202 is coupled to provide power to Tx PLL 214. Similarly, for each of the regulators 208, 210 and 212 that are coupled to the corresponding circuits, namely, Rx PLL 216, Tx PISO 218 and Rx SIPO 220, the corresponding switch to the 1.5 VDC power supply 202 is decoupled. Alternatively, for each regulator 208, 210 and 212 that is decoupled, the corresponding circuit is coupled to the 1.5 VDC power supply 202.

Continuing to refer to FIG. 5, MGT FPGA 200 includes a first MGT circuit group that includes the Tx PLL 214 and Rx PLL 216 and a second MGT circuit group that includes only Tx PISO 218. It is understood that the first MGT circuit group does not necessarily include both the Tx and Rx PLLs and can include any circuit within MGT FPGA 200 for which it is beneficial to select between regulated power and unregulated power according to user preferences or modes of operation. Similarly, while second MGT circuit group includes only Tx PISO 218, it may readily be expanded to include other circuits, including Rx SIPO 220. Rx SIPO 220 is not included here in the second MGT circuit group because, in the preferred embodiment of the invention, the benefits of providing regulated power to Rx SIPO 220 do not justify providing regulated power thereto based upon the increased power consumption that results therefrom.

As may be seen, generally, each circuit group, and each circuit within each circuit group, is coupled either to a regulated power source or an unregulated power source due to opposite logic states of control signals that selectively couple the regulated power sources and the unregulated power sources to the circuits and circuit groups. Moreover, in one embodiment of the invention, each circuit within a circuit group is coupled to only one regulated power source and to the unregulated power source. In this embodiment, all of the circuits within the circuit group are jointly coupled to the regulated power source and jointly decoupled from the unregulated power source and, alternatively, coupled to the unregulated power source. Finally, the Tx PISO 218 is, in one embodiment of the invention, programmable transmit PMA module 38 of FIG. 2, and the Rx SIPO is programmable receive PMA module 40 of FIG. 2.

Along these lines, power supply logic 222 may be formed of discreet logic formed for the particular purposes illustrated in FIG. 5. Alternatively, however, power supply logic 222 may also be defined within a reconfigurable control register as formed within an MGT FPGA to control logic between the various configurations of the FPGA. Referring to the default mode-related logic of power supply logic 222, the power supply logic 222 generally is operable to control the coupling of one or more regulators to a corresponding circuit at higher speeds of operation. One reason for this is that jitter and phase noise may not be tolerable at higher speeds of operation. For example, 10 pico-seconds of phase noise is often tolerable for serial data streams in the 2.5 gigabit range, but may well be intolerable at the 10 gigabit data rate. Thus, depending on a selected mode or speed of operation, power supply logic 222 will decouple the regulated power sources from the corresponding circuits accordingly. In one embodiment of the invention, the speed of the transceivers is defined by selected primitives (modes of operation). For example, if a selected primitive or mode of operation calls for serial data transmissions in the range of 2.5-3.125 gigabits per second, then power supply logic 222 will decouple each of the regulators 206-212 and will couple 1.5 VDC power supply 202 to the corresponding circuits or circuit groups. If the selected mode of operation includes transmitting data in the 5-7 gigabits per second range, power supply logic 222 will couple the circuits within the first MGT circuit group, namely, Tx PLL 214 and Rx PLL 216, to regulators 206 and 208, respectively, and will decouple the 1.5 VDC power supply 202. The Tx PISO 218 and Rx SIPO 220, however, remain coupled to the 1.5 VDC power supply 202 and decoupled from regulators 210 and, optionally, 212, respectively, in this described embodiment of the invention. If the selected mode of operation includes transmitting data at the 10 gigabits per second rate, however, then all of the regulators 206, 208, 210 and 212 are coupled to the corresponding circuits, namely, TX PLL 214, Rx PLL 216, Tx PISO 218 and Rx SIPO 220. The 1.5 VDC power supply 202 is decoupled from each of these circuits.

The above-described logic for coupling and decoupling the 1.5 VDC power supply 202 and the regulators 206-212 is mode-dependent and, more particularly, data rate transmission speed dependent in the described embodiment of the invention. The logic is generally defined as default logic within power supply logic 222. Power supply logic 222 is further coupled, however, to receive user preferences from an external source and to operate accordingly. Thus, for example, if MGT FPGA 200 is particularly concerned with recovering an accurate clock but less concerned about phase noise in an output produced by MGT FPGA 200, the user preferences might call for always coupling regulator 208 to Rx PLL 216 and decoupling Rx PLL 216 from the unregulated power source, namely, 1.5 VDC power supply 202. According to this example, Tx PLL 214 may be coupled to regulator 206 or, alternatively, to 1.5 VDC power supply 202 according to default logic, or, if specified by the user preferences, according to user preferences (e.g., never). Thus, the logic is operable to receive and execute externally provided logic (e.g., user logic).

Figure 6:
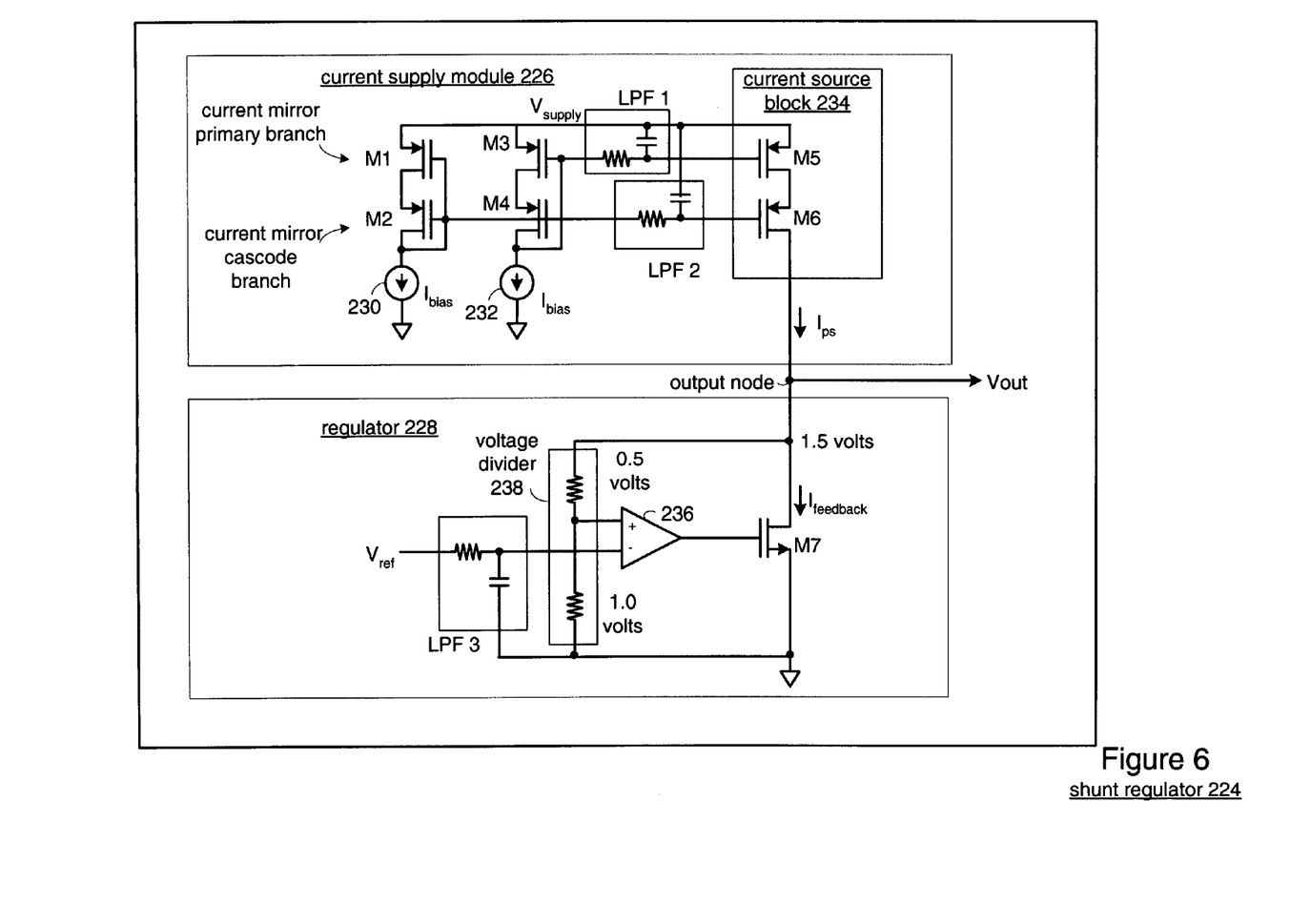
FIG. 6 is a functional schematic diagram of a shunt regulator that may be used to provide regulated power to a circuit or circuit group according to one embodiment of the invention.

FIG. 6 is a functional schematic diagram of a shunt regulator 224 that may be used to provide regulated power to a circuit or circuit group according to one embodiment of the invention. Shunt regulator 224 includes a current supply module 226 and a regulator 228 that are both coupled to an output node of shunt regulator 224. Generally, current supply module 226 provides an output power supply current ($I_{ps}$) into the output node. Regulator 228 sinks current from the output node to maintain a 1.5 VDC output ($V_{out}$) at the output node. Generally, any increase in $I_{ps}$ that would tend to cause the output voltage $V_{out}$ from the output node to increase above 1.5 volts results in a corresponding increase in $I_{feedback}$, thereby maintaining a constant or regulated output voltage level of 1.5 volts.

Referring to current supply module 226, different current supply configurations may be utilized so as to provide a power supply current, here $I_{ps}$, into the output node to result in a specified output voltage. As discussed before, the specified output voltage is equal to 1.5 VDC. Current supply module 226 of shunt regulator 224 includes a current mirror primary branch and a current mirror cascode branch for providing $I_{ps}$ in the described embodiment. Generally, a current source 232 provides a bias current ($I_{bias}$) for reference device M3 and mirror device M5. Stated differently, current source 232 sets up the gate voltage levels (bias levels) for devices M3 and M5. Current source 230, on the other hand, sets up the gate voltages for cascode devices M1, M2, M4 and M6. As is known by one of average skill in the art, a cascode device such as M6 increases an output impedance of a current source. Devices M2 and M4 establish the reference current for M6. Finally, M1, as configured with M2, may alternatively be replaced by a single device. The configuration as shown provides a method for increasing an effective channel length of a reference device (here for a cascode branch of a current mirror) while taking advantage of symmetry from process and design techniques.

As is known by one of average skill in the art, the current $I_{bias}$ produced by current source 230 biases M1 and M2 in a current mirror configuration to conduct a reference current that is equal to $I_{bias}$. Mirror devices M3, M4, M5 and M6 will also generate a proportional amount of current relative to $I_{bias}$ because their gates are coupled to the gates of reference devices M1 and M2. As is known by one of average skill in the art, the current reflected in the mirror devices, here, devices M3, M4, M5 and M6, tends to be proportional to the current in the reference devices (here, devices M1 and M2) as a function of the scaling of the devices.

Equally scaled devices will result in the mirror devices conducting the same amount of current as the reference devices. If, however, the length or width is increased for the mirror devices, then the current conducted also increases as a function of the relative difference between the scaling of the mirror devices and reference devices. Additionally, the gate of mirror device M3 is further coupled to an additional current source 232 which increases the current conducted by M3 (mirror device) relative to reference device M1.

As may also be seen, a low pass filter (LPF) 1 is coupled between the gate of mirror device M5 and the gates of mirror devices M1 and M3. A second low pass filter (LPF) 2 is coupled between the gates of mirror M6 and devices M2 and M4. The LPF 1 and LPF 2 filter high frequency noise present within current supply module 226 to further improve the regulated output of $I_{ps}$.

In the described embodiment of the invention, mirror devices M5 and M6 are part of a current source block 234. Current source block 234 comprises mirror devices that produce the current supply module 226 output current $I_{ps}$. In the described embodiment of the invention, the magnitude of output current $I_{ps}$ is selectable within current source block 234. As will be shown in greater detail in the figures that follow, current source block 234 includes a plurality of selectable scaled devices that provide differing output current levels. Thus, current source block 234 provides for adjustable output current levels.

Regulator 228 includes a comparator 236 that is coupled to provide a bias signal to a gate of device M7 to prompt device M7 to conduct feedback current $I_{feedback}$. Comparator 236 is coupled, at a positive input, to a voltage divider 238. Voltage divider 238 comprises a plurality of resistors configured as a voltage divider to provide a specified input voltage to the positive terminal of comparator 236 in the described embodiment. A reference voltage is further produced to a negative input of comparator 236. Accordingly, the output voltage provided by comparator 236, and more specifically, a bias voltage of M7, is based upon a difference of the voltage divider input and the reference voltage received at the positive and negative inputs of comparator 236, respectively. As may also be seen, a third low pass filter, LPF 3, is coupled to filter the reference voltage received at the negative input of comparator 236 to reduce high frequency noise components within the reference voltage.

Ideally, the reference voltage received from a reference circuit or source, $V_{ref}$, will be a specified value. Because, however, due to either process, temperature or other circuit conditions, $V_{ref}$ may vary from a desired or specified value. Accordingly, voltage divider 238 is formed to include a plurality of selectable resistor values to provide adjustability in the voltage divider ratios of voltage divider 238 to provide further adjustability to the input voltage received at the positive input of comparator 236. In ideal circumstances, in the described embodiment of the invention, $V_{ref}$ is equal to 1 volt.

Because a desired output voltage of the output node $V_{out}$ is equal to 1.5 VDC, the resistors of voltage divider 238 are scaled to cause the input voltage of the positive input of comparator 236 to also equal 1 volt. In this scenario, M7 remains off resulting in $I_{feedback}$ being equal to 0. In the described embodiment of the invention, voltage divider 238 is desirably scaled so that ⅔ of the output voltage is dropped between the positive input of comparator 236 and ground, while ⅓ of the output voltage $V_{out}$ is dropped across the positive input of comparator 236 and the output node. Because the desired output voltage is equal to 1.5 VDC, the desirable voltage drop between the positive input of comparator 236 and $V_{out}$ is equal to 0.5 volts, while the desired voltage drop between the positive input of comparator 236 and ground is equal to 1.0 volts.

Figure 7:
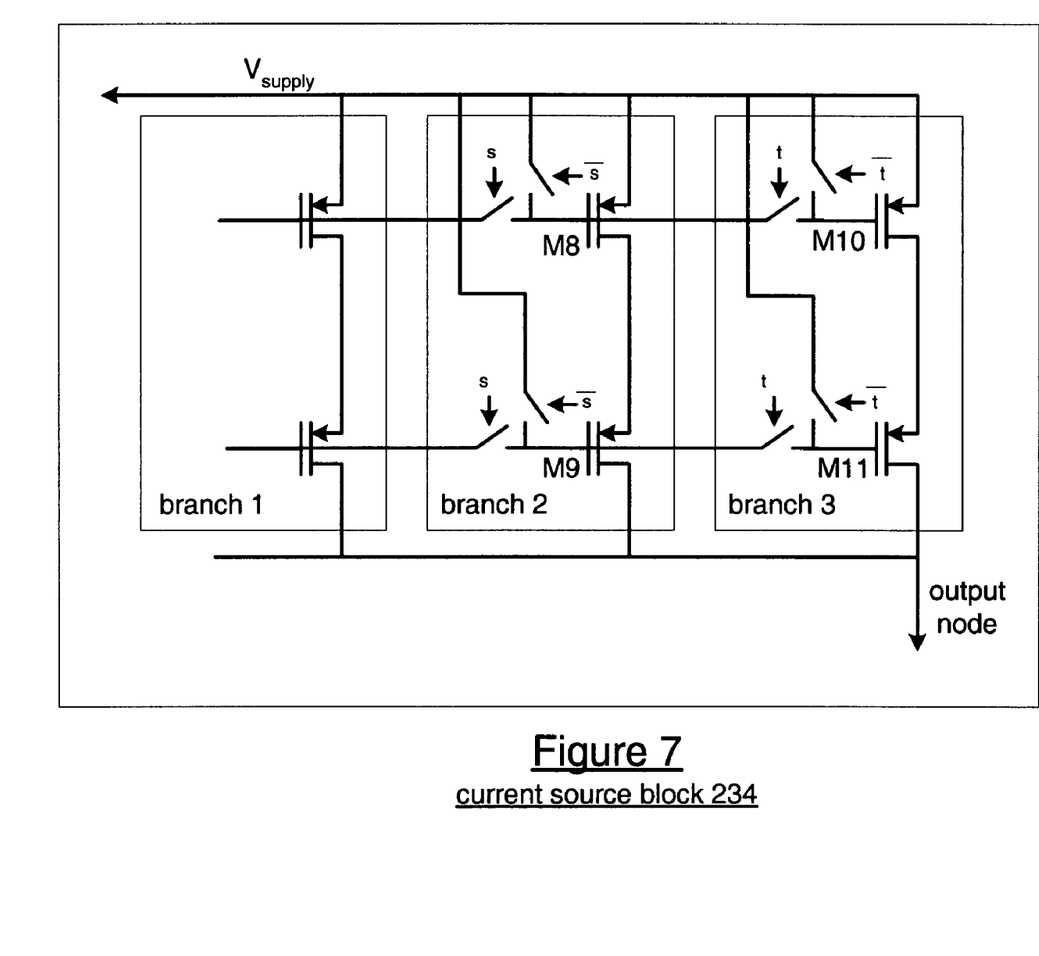
FIG. 7 is a schematic illustrating one embodiment of the invention of a current source block.

FIG. 7 is a schematic illustrating one embodiment of the invention of current source block 234. Generally, current source block 234 includes a plurality of selectively coupled mirror devices coupled substantially as shown. As may be seen, current source block 234, in the described embodiment of the invention, comprises three branches for conducting current. According to the described embodiment, branch 1 is permanently coupled between a voltage supply and an output node, while branches 2 and 3 are selectively coupled between the output node and the supply.

The current produced by selectively coupled branches 2 and 3 is superimposed, or added to, the current produced by branch 1. In the described embodiment of the invention, the mirror devices of branch 1 and branch 2 are scaled to both provide 15 milliamps of current based upon, or in relation to, reference currents defined by current sources 230 and 232 of shunt regulator 224 of FIG. 6. Branch 3, however, is scaled to produce twice as much current as either branch 1 or branch 2 and, more specifically, is scaled to produce 30 milliamps of current.

According to which branch of branches 2 and 3 are selected, the total output current at the output node will be equal to either 15 milliamps, 30 milliamps, 45 milliamps or 60 milliamps. These values, of course, are merely exemplary and are a function of device scaling according to design. In general, as may be seen, if branch 2 is selected, external logic produces a logic signal represented as "s" to couple devices M8 and M9 to provide additional current in the current mirror configuration of current source block 234. The logic signal "s" may be a signal that actually closes a switch or it may be bias signal that biases devices M8 and M9 into operation. Devices M8 and M9 are PMOS devices in the described embodiment of the invention.

As may be seen, when devices M8 and M9 are not to be coupled to provide additional mirror current to the output node, the logical opposite of "s" causes the gates of PMOS devices M8 and M9 to go to the supply to turn those devices off. Similarly, a logic signal "t" serves to couple devices M10 and M11 (either logically or actually), while the logical opposite of "t" causes the gates of M10 and M11 to go to supply to turn off M10 and M11. Thus, external logic (not shown here in FIG. 7) may be used to set "s" and "t" or their logical opposites to selectively couple or decouple the mirror devices of branch 2 and branch 3, respectively.

Devices M8 and M9 are scaled, in the described embodiment, similarly to the permanently coupled devices of branch 1 in the described embodiment. Devices M10 and M11, however, are scaled to provide twice as much current as the permanently coupled devices of branch 1. As such, in the described embodiment, since the devices of branch 1 are scaled to conduct 15 milliamps, the devices of branch 2 are also scaled to conduct 15 milliamps, while the devices of branch 3 are scaled to conduct 30 milliamps of current.

Figure 8:
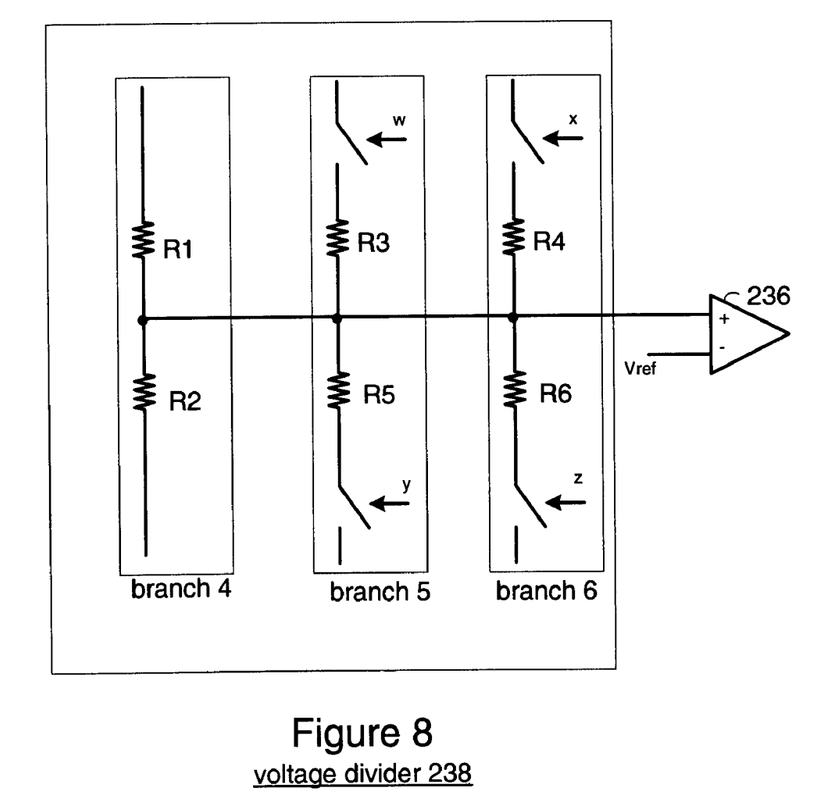
FIG. 8 is a functional schematic diagram of a voltage divider.

FIG. 8 is a functional schematic diagram of voltage divider 238. As may be seen, voltage divider 238 comprises two permanently coupled voltage divider resistors R1 and R2. Voltage divider 238 also includes selectively coupled resistors R3 and R4, which may be selectively coupled in parallel to R1. Additionally, voltage divider 238 includes two selectively coupled resistors R5 and R6 that are selectively coupled in parallel to R2. Each of the selectively coupled resistors R3, R4, R5 and R6 may be selectively coupled with unique control signals so as to maximize the adjustability and the corresponding voltage divider ratios of voltage divider 238. Thus, for example, if external logic sets any one of logic signals w, x, y and z, the corresponding selectable resistors R3, R4, R5 and R6 are coupled into connection with resistors R1 and R2. While there are many permutations of the various coupled configurations, in one example, if all resistors are coupled, meaning that w, x, y and z are all set to logic 1, then the total voltage divider ratio will be a function of the parallel resistance of R2, R5 and R6 divided by the parallel resistance of R2, R5 and R6 plus the parallel resistance of R1, R3 and R4. The resulting voltage divider ratio will result in a corresponding input voltage at the positive input of comparator 236 being equal to $V_{out}$ times the resulting voltage divider ratio.

One advantage provided by having selectable voltage divider ratios substantially as shown in FIG. 8 is that the ratios may be adjusted to compensate for differing values of a reference voltage $V_{ref}$. While $V_{ref}$ is ideally equal to 1, the voltage divider ratios as provided by voltage divider 238 may be adjusted by selectively coupling any one of R3, R4, R5 and R6, to change the overall resistance and voltage divider ratio to compensate for changes in the reference voltage $V_{ref}$ from an expected value.

Figure 9:
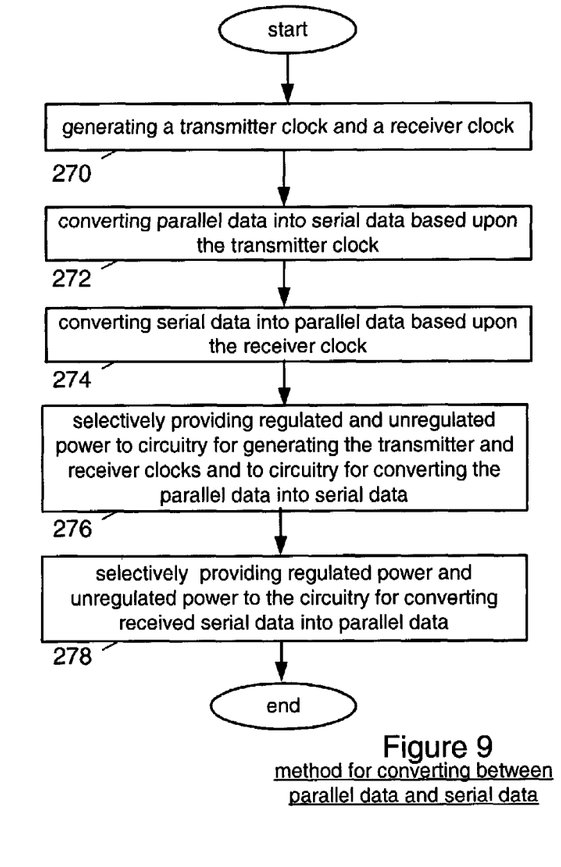
FIG. 9 is a flowchart illustrating one method for transmitting data according to one embodiment of the present invention.

FIG. 9 is a flowchart illustrating one method for transmitting data according to one embodiment of the present invention. The invention of FIG. 9 generally includes generating a transmitter clock and a receiver clock for transmit and receive operations (step 270). For parallel data that is received and is to be transmitted serially, the method includes converting the parallel data into serial data based upon the transmitter clock (step 272). For serial data that is received and is to be converted into parallel data, the method includes converting the serial data based upon the receiver clock (step 274). Additionally, the invention includes selectively providing regulated and unregulated power to circuitry for generating the transmitter and receiver clocks and to circuitry for converting the parallel data into serial data (step 276). As has been described above, the logic for selecting between regulated and unregulated power includes logic for selecting between regulated and unregulated power according to a data rate and according to noise tolerance capability for a given circuit or for a given application. The logic for selecting between regulated and unregulated power to various circuits or circuit groups may be specified either by default logic or by user preferences received from an external source.

The invention further optionally includes selectively providing regulated and unregulated power to circuitry for converting received serial data into parallel data (step 278). As discussed before, output parallel data has a period that is significantly greater than the input serial data and is therefore more noise tolerant. Thus, in the described embodiment of the invention, the circuitry that receives serial data to produce parallel data is typically powered only with unregulated power as noise tolerance is significantly higher relative to phase-locked loop circuitry and to the circuitry for converting parallel data into serial data.

Figure 10:
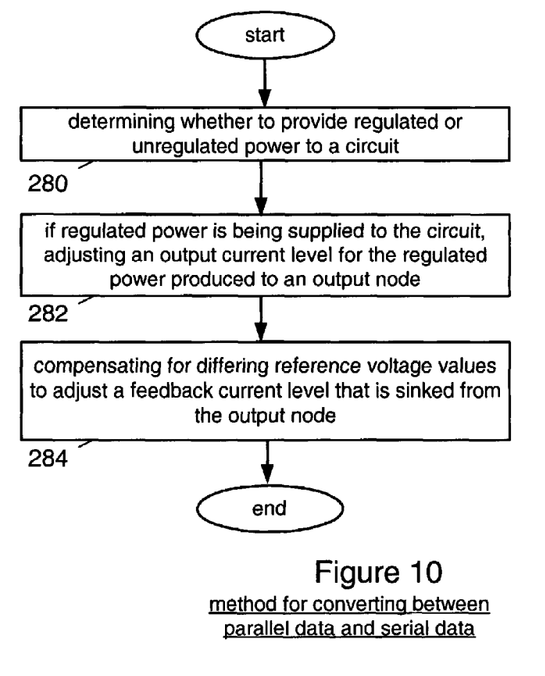
FIG. 10 illustrates a method according to a second embodiment of the invention for providing power to a specified circuit or circuit group according to one embodiment of the invention.

FIG. 10 illustrates a method according to a second embodiment of the invention for providing power to a specified circuit or circuit group according to one embodiment of the invention. Initially, the method includes determining whether to provide regulated or unregulated power to the circuit or circuit group (step 280). If regulated power is to be supplied, the invention includes optionally adjusting an output current level for the regulated power produced to an output node of a regulator (step 282). As described above, in one embodiment of the invention, the output current level is regulated by selectively coupling output current mirror devices which output current levels are all coupled and produced to the output node. The invention further includes compensating for differing reference voltage values to adjust a feedback current level that is sinked from the output node (step 284). As has been described before, under ideal circumstances, a reference voltage will be an exact and specified value. However, because the reference voltage values differ from desirable levels, the inventive method includes adjusting an input voltage level as a function of selectable voltage divider ratios for comparison to the reference voltage to therefore adjust the feedback current levels that are sinked from the output node.

The invention disclosed herein is adaptable to various modifications and alternative forms. Therefore, specific embodiments have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A multi-giga bit transceiver (MGT) system for converting between parallel data and serial data comprising:
   first MGT circuitry for performing a first MGT function;
   second MGT circuitry for performing a second MGT function;
   at least one regulated power source and at least one unregulated power source, both coupled to selectively provide regulated and unregulated power to the first and second MGT circuitry;
   programmable logic for providing control signals to select and operatively couple the first and second MGT circuitry to one of the at least one regulated and unregulated power sources;
   receiver serial-in-parallel-out circuitry (Rx SIPO); and
   a selectable power regulator for the Rx SIPO circuitry.

2. The MGT system of claim 1 wherein the at least one regulated power source comprises an unregulated supply and a plurality of power regulators coupled to selectively provide regulated power from the supply to the first and second MGT circuitry.

3. The MGT system of claim 2 wherein the first MGT circuitry comprises a phase-locked loop (PLL).

4. The MGT system of claim 3 wherein the PLL further includes a transmitter phase-locked loop (Tx PLL) for generating a transmitter clock.

5. The MGT system of claim 3 wherein the PLL further includes a receiver phase-locked loop (Rx PLL) for generating a receiver clock.

6. The MGT system of claim 2 further comprising a selectable power regulator for a first MGT circuit group that includes a transmitter phase locked-loop (Tx PLL) and a receiver phase locked-loop (Rx PLL) a that are jointly coupled to one of the regulated power source and the unregulated power source.

7. The MGT system of claim 2 wherein the power regulators each further comprises a current mirror having a reference current stage and selectable current mirror stages for providing one of a plurality of current levels into an output node.

8. The MGT system of claim 7 wherein the power regulators of the plurality of selectable power regulators each further comprises a voltage regulator stage for adjustably sinking current from the output node to maintain a specified output voltage at the output node.

9. The MGT system of claim 8 wherein the voltage regulator stage further includes an amplifier and a voltage divider with selectable divider resistors to create selectable voltage divider ratios, the voltage divider coupled to an input of the amplifier.

10. The MGT system of claim 9 further including logic for selecting the selectable divider resistors wherein the voltage regulator stage is further coupled to receive a reference voltage and wherein the logic selects the selectable divider resistors responsive to fluctuations in the reference voltage from an expected value to create a specified voltage divider ratio to enable the voltage regulator stage to produce an expected output voltage.

11. The MGT system of claim 1 wherein the Rx SIPO receives only unregulated power.

12. The MGT system of claim 1 wherein the programmable logic selects between regulated power and unregulated power for the Rx SIPO.

13. A power regulator within programmable logic device (PLD) coupled to a power supply comprising:
- a current mirror having a reference current stage and selectable current mirror stages for providing one of a plurality of current levels into an output node;
- a voltage regulator stage coupled to adjustably sink current from and source current to the output node to maintain a specified output voltage at the output node;
- wherein the output node of the current mirror is further coupled to at least one selectable switch to selectively provide regulated power to at least one of a transmit parallel-in-serial-out (Tx PISO) transmitter phase locked-loop (Tx PLL) and a receiver phase locked-loop (Rx PLL);
- wherein the voltage regulator stage further includes an amplifier and a voltage divider with selectable divider resistors to create selectable voltage divider ratios, the voltage divider coupled to an input of the amplifier; and
- wherein the voltage regulator stage is further coupled to receive a reference voltage from a reference circuit and control signals from logic within the PLD for selecting divider resistors to create a specified voltage divider ratio to compensate for variations in the reference voltage.

14. The power regulator of claim 13 wherein the at least one selectable switch also selectively provides regulated power to a receiver serial-in-parallel-out circuitry (Rx SIPO).

15. A method within a high data rate transceiver for converting between parallel data and serial data and for providing regulated power and unregulated power, comprising:
- generating a transmitter clock and a receiver clock;
- converting parallel data into serial data according to the transmitter clock;
- converting serial data into parallel data according to the receiver clock;
- selectively providing regulated and unregulated power to circuitry for generating the transmitter and receiver clocks and to circuitry for converting the parallel data into serial data; and
- selecting between regulated power and unregulated power and generating corresponding control signals to circuitry for generating the transmitter and receiver clocks and circuitry for converting the parallel data into serial data.

16. The method of claim 15 further including selectively providing regulated power and unregulated power to a receiver serial-in-parallel-out circuitry (Rx SIPO).

17. The method of claim 16 further including selecting and providing one of a plurality of current levels into an output node.

18. The method of claim 17 further including adjustably sinking current from the output node to maintain a specified output voltage at the output node.

19. The method of claim 17 further including selecting and adjusting voltage divider ratios coupled to an input of a voltage regulator that performs the step of adjustably sinking current from the output node to maintain the specified output voltage at the output node.

* * * * *